United States Patent [19]
Bui et al.

[11] Patent Number: 5,712,510
[45] Date of Patent: Jan. 27, 1998

[54] REDUCED ELECTROMIGRATION INTERCONNECTION LINE

[75] Inventors: Nguyen Duc Bui, San Jose; Donald L. Wollesen, Saratoga, both of Calif.

[73] Assignee: Advanced Micro Devices, Inc., Sunnyvale, Calif.

[21] Appl. No.: 511,878

[22] Filed: Aug. 4, 1995

[51] Int. Cl.$^6$ .................. H01L 23/528; H01L 23/535
[52] U.S. Cl. .................. 257/758; 257/211; 257/767; 257/775
[58] Field of Search .................. 257/207, 211, 257/750, 758, 763–765, 767, 776, 920, 775

[56] References Cited

U.S. PATENT DOCUMENTS

| | | | |
|---|---|---|---|
| 5,060,045 | 10/1991 | Owada et al. | 257/211 |
| 5,093,279 | 3/1992 | Andreshak et al. | 437/173 |
| 5,101,261 | 3/1992 | Maeda | 357/68 |
| 5,136,361 | 8/1992 | Wollesen et al. | 357/67 |
| 5,262,354 | 11/1993 | Cote et al. | 437/195 |
| 5,289,036 | 2/1994 | Nishimoto | 257/774 |
| 5,313,100 | 5/1994 | Ishii et al. | 257/767 |
| 5,329,162 | 7/1994 | Nadaoka | 257/774 |
| 5,382,831 | 1/1995 | Atakov et al. | 257/773 |
| 5,391,920 | 2/1995 | Tsuji | 257/920 |
| 5,461,260 | 10/1995 | Varker et al. | 257/767 |
| 5,470,788 | 11/1995 | Biery et al. | 437/190 |

FOREIGN PATENT DOCUMENTS

| | | | |
|---|---|---|---|
| 0160392 | 11/1985 | European Pat. Off. | 257/920 |
| 0227569 | 10/1991 | Japan | 257/758 |

OTHER PUBLICATIONS

IBTDB, Elimination of CMOS Electromigration–Induced Extrusions, vol. 31, No. 6, Nov. 1988, pp. 461–462, 257/767.

Blech, "Electromigration in thin aluminum films on titanium nitride," Journal of Applied Physics, vol. 47, No. 4, Apr. 1976, pp. 1203–1208.

Li et al., "Increase in Electromigration Resistance by Enhancing Backflow Effect," IEE/RPS, 1992, pp. 211–216.

Joshi, "A New Damascene Structure for Submicrometer Interconnect Wiring," IEEE Electron Letters, vol. 14, No. 3, Mar. 1993, pp. 129–132.

Kaanta et al., "Dual Damascene: A ULSI Wiring Technology," Jun. 11–12, 1991, VMIC Conference, IEEE, pp. 144–152.

Kenney et al., "A Buried–Plate Trench Cell for a 64–Mb DRAM," 1992 Symposium on VLSI Technology Digest of Technical Papers, IEEE, pp. 14–15.

Zhang et al., "An Increase of the Electromigration Reliability of Ohmic Contacts by Enhancing Backflow Effect," IEEE, 1995, pp. 365–370.

Filippi et al., "Evidence of the Electromigration Short–Length Effect in Aluminum–Based Metallurgy with Tungsten Diffusion Barriers," Materials Research Society Symp. Proc., vol. 309, 1993, pp. 141–148.

Primary Examiner—Peter Toby Brown
Attorney, Agent, or Firm—Lowe, Price, LeBlanc & Becker

[57] ABSTRACT

The electromigration lifetime of a metal interconnection line is increased by adjusting the length of the interconnection line, or providing longitudinally spaced apart holes or vias, to optimize the Backflow Potential Capacity of the metal interconnection line.

5 Claims, 3 Drawing Sheets

REDUCED ELECTROMIGRATION INTERCONNECTION LINE

TECHNICAL FIELD

The present invention relates to a semiconductor device containing an interconnection line, and to a method of manufacturing the semiconductor device, wherein the lifetime of the interconnection line is maximize with respect to electromigration failure.

BACKGROUND ART

Conventional semiconductor devices typically comprise a semiconductor substrate, a plurality of insulating and conductive levels formed thereon having a conductive interconnection pattern comprising features, such as a plurality of spaced apart conductive lines, and several types of conductive interconnection lines, such as bus lines, power supply lines and clock lines, having a width greater than the width of the minimum width conductive lines according to the design rule of the semiconductor device. Increasing demands for density and performance associated with ultra-large scale integration semiconductor wiring require responsive changes in interconnection technology which is considered one of the most demanding aspects of ultra-high scale integration technology. High density demands for ultra-large scale integration semiconductor wiring require planarized layers with minimal design features, including spacing between conductive lines.

A limitation on the lifetime and reliability of conventional semiconductor devices attributed to conductive interconnection lines is due to electromigration. The phenomenon of electromigration involves the flow of electrons causing the migration of atoms, thereby generating voids and hillocks. The formation of voids creates an opening in a conductive interconnection line, thereby decreasing the performance of the interconnection line. The formation of voids generates areas of increased resistance which undesirably reduce the speed of a semiconductor device. Thus, the electromigration phenomenon constitutes a limitation on the lifetime of a conductive interconnection line as well as the performance of the semiconductor device.

Electromigration in a metal interconnection line can be characterized by the movement of ions induced by a high electrical current density. As the miniaturization of the feature sizes of semiconductor devices increases, the current density also increases and, hence, electromigration induced metallization failures increase. Current metallization failures resulting from electromigration exceed about 30% of the total of metallization failures.

Prior attempts to restrain electromigration involve the use of overcoating, alloying, or multilevel metallization, which approaches do not directly address the electromigration phenomenon. In copending U.S. patent application Ser. No. 08/476,512 (our Docket No. 1033-106 filed on Jun. 7, 1995), an approach is disclosed to enhance the electromigration lifetime of a metal interconnection line by optimizing the width of the metal interconnection line consistent with the minimum time for 50% failure by electromigration according to the Bamboo Effect for the metal. The disclosed technique comprises the formation of one or more slots through the metal interconnection line, wherein the number, length and width of each slot is determined by the Bamboo Effect for that metal so that the total width of actual metal across the interconnection line is less than that which corresponds to the minimum time for 50% failure by electromigration according to the Bamboo Effect for that metal.

In a study of the kinetics of electromigration in the 1970's, it was reported that electromigration induced metallic ion accumulation generates a chemical potential gradient which is capable of counteracting or driving the ions in the opposite direction caused by electromigration. This phenomenon is characterized as the Backflow Effect. See Blech, "Electromigration in thin aluminum films on titanium nitride," Journal of Applied Physics, Vol. 47, No. 4, April 1976, pp. 1203–1208. The laboratory investigation conducted by Blech indicates that extremely short aluminum stripes did not exhibit signs of electromigration because it was operating below the threshold current density which was found to be approximately inversely proportional to stripe length. It is also reported that it is not clear whether surface electromigration is an important diffusion path.

A subsequent research study on electromigration and the Backflow Effect is reported by Li et al., "Increase in Electromigration Resistance by Enhancing Backflow Effect," IEEE/RPS, 1992, pp. 211–216. Li et al. refer to the work of Dr. Blech and his study of the kinetics of electromigration and the Backflow Effect which was characterized as an inverse electromigration effect which can be employed to offset a certain amount of electromigration induced ion flow. The work reported by Li et al. is directed to enhancing the Backflow Effect and, hence, decreasing electromigration. Li et al. report that according to the basic theory of electromigration, the important factors are electrical current density, thin film structure, temperature and gradients. It is also reported that for a particular metal, i.e., a particular elemental metal or a particular alloy, there exists a Backflow Potential Capacity which depends upon the gap distance or length of a metal stripe of the metal. Such a dependence of the Backflow Potential Capacity on the gap distance is shown in FIG. 1 for aluminum.

In the discussion, Li et al. report the results of experimentation and an attempt to utilize the Backflow Potential Capacity in order to reduce electromigration. In the first reported experimentation, a discontinuous silicon dioxide passivation film was employed to provide non-uniform compression on an aluminum film, thereby altering the aluminum ion migration velocity along the stripe. This result was said to cause the aluminum ions to accumulate in an anode region, thereby depleting the cathode region and producing a backward ion-backflow to offset electromigration. Based on the observed results, a simplified theoretical model was proposed to explain the Backflow Effect. In the second reported experimentation, the difference in electromigration resistance between two different types of metal materials, titanium and an aluminum alloy containing 2% copper, was employed to generate a Backflow Effect. However, the successful application of the Backflow Effect to reduce electromigration in actual semiconductor devices has, to our knowledge, not yet been implemented.

The continuing demand for increased miniaturization requires conductive patterns comprising features, such as conductive lines and interwiring spacings, less than about 1.0 micron. Semiconductor devices comprising conductive patterns having submicron design features are characterized by a high electrical current density and, consequently, increased metallization electromigration failures. The requirement for a long electromigration lifetime is of critical importance for an interconnection system. Thus, there exists a need in the semiconductor art for increasing the electromigration lifetime of an interconnection line.

DISCLOSURE OF THE INVENTION

An object of the present invention is a highly integrated semiconductor device containing an interconnection structure having an enhanced electromigration lifetime.

Another object is an improved method of manufacturing a semiconductor device having a metal interconnection line with an enhanced electromigration lifetime.

Additional objects, advantages and other features of the invention will be set forth in part in the description which follows and in part will become apparent to those having ordinary skill in the art upon examination of the following or may be learned from practice of the invention. The objects and advantages of the invention may be realized and obtained as particularly pointed out in the appended claims.

According to the present invention, the foregoing and other objects are achieved in part by a semiconductor device comprising: a conductive pattern having features; an insulating layer formed on the conductive pattern; and a metal interconnection line formed on the insulating layer; wherein the metal interconnection line has a length less than the length corresponding to the minimum Backflow Potential Capacity for the metal interconnection line.

Another aspect of the present invention is a semiconductor device comprising: a conductive pattern having features; a first insulating layer formed on the conductive pattern; a first metal interconnection line formed on the first insulating layer; a second insulating layer formed on the first metal interconnection line; and at least two longitudinally spaced apart first conductive vias formed through the second insulating layer in electrical contact with the first metal interconnection line at first contact points separated by a first distance longitudinally which is less than the length corresponding to the minimum Backflow Potential Capacity for the first metal interconnection line.

A further aspect of the present invention is a semiconductor device comprising: a conductive pattern having features; an insulating layer formed on the conductive pattern; a metal interconnection line formed on the insulating layer and having at least two longitudinally spaced apart openings; wherein the length of the metal interconnection line is greater than the length corresponding to the minimum Backflow Potential Capacity for the metal interconnection line occurs, and the longitudinal distance between the two openings is less than the length corresponding to the minimum Backflow Potential Capacity for the metal interconnection line.

Another aspect of the present invention is a semiconductor device comprising a conductive pattern having features; an insulating layer formed on the conductive pattern; a metal interconnection line formed on the insulating layer having an opening therethrough; wherein the length of the metal interconnection line is greater than the length corresponding to the minimum Backflow Potential Capacity for the metal interconnection line and the longitudinal distance from either end to the opening is less than the length corresponding to the minimum Backflow Potential Capacity for the metal interconnection line.

A further aspect of the present invention is a method of manufacturing a semiconductor device, which method comprises: forming a first insulating layer; forming a conductive pattern by a damascene process, wherein the conductive pattern comprises a plurality of conductive lines; forming a second insulating layer on the conductive pattern; forming a metal interconnection line on the second insulating layer; wherein, the length of the metal interconnection line is less than length corresponding to the minimum Backflow Potential Capacity for the metal interconnection line.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

The electromigration lifetime of a metal interconnection line constitutes a significant limitation of the capabilities of conventional semiconductor devices, particularly high density devices. The electromigration failure limitation becomes particularly acute as the integrated semiconductor device becomes increasingly higher in performance (faster operating frequency) due to the corresponding increase in current density which increases the electromigration phenomenon. The present invention addresses and solves that problem by extending the electromigration lifetime of a metal interconnection line, and improving the performance of the semiconductor device.

In accordance with the present invention, the Backflow Potential Capacity is optimized for the particular species of metal employed in a metal interconnection line in a semiconductor device. In an embodiment of the present invention, the effective length of a particular metal interconnection line is optimized and/or controlled by appropriate engineering and design to optimize the Backflow Potential Capacity, thereby minimizing electromigration and enhancing the electromigration lifetime of a metal interconnection line.

Figure 1:
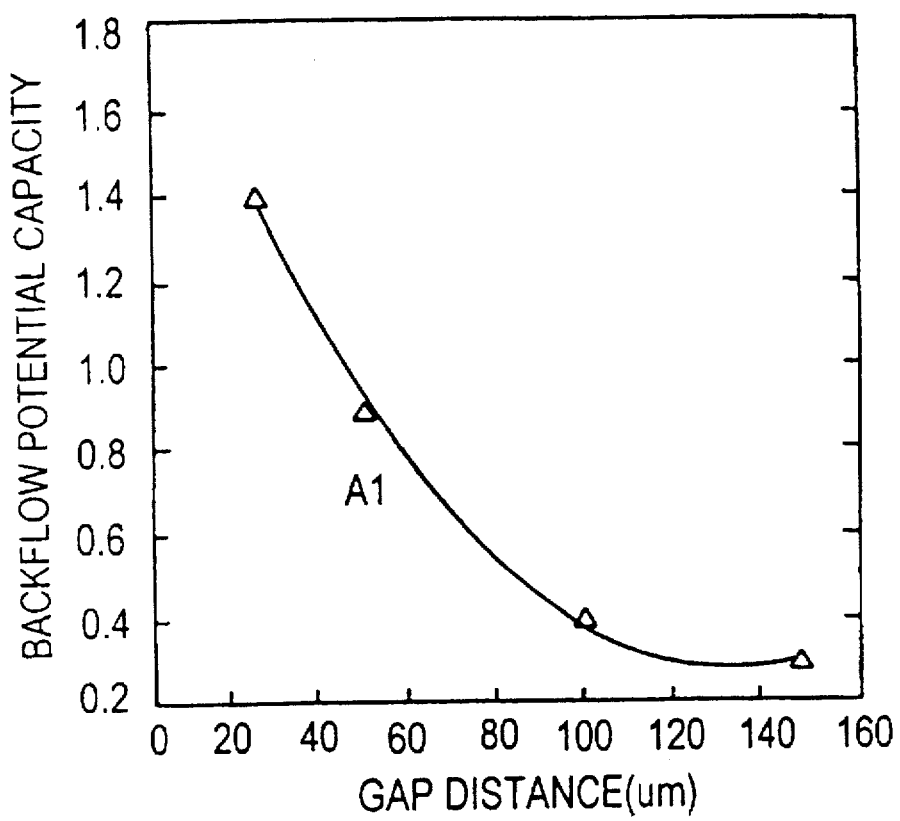
FIG. 1 is a curve illustrating the Backflow Potential Capacity for aluminum.

The current dramatic decrease in the design rule of semiconductor devices and the ever increasing demand for higher and higher performance in semiconductor devices, requiring conductive patterns with minimal design features, exacerbates metallization failure due to electromigration. However, the reduction in the design rule into the submicron range enables the strategic placement of metal interconnection lines having a length purposely designed to optimize the Backflow Potential Capacity for that particular metal. Thus, one embodiment of the present invention comprises a semiconductor device comprising a conductive pattern having features in accordance with a given design rule with an insulating layer formed on the conductive pattern. A metal interconnection line is formed on the insulating layer having a length less than the length corresponding to the minimum Backflow Potential Capacity for that particular metal interconnection line. In practicing the present invention, one having ordinary skill in the art would readily understand that the minimum Backflow Potential Capacity for a particular metal, i.e., elemental metal or metal alloy, must be determined for that particular metal, such as for aluminum as shown in FIG. 1.

In accordance with the present invention, various conductive metals can be employed for the interconnection line, such as aluminum, aluminum alloys, copper, copper alloys, silver, silver alloys, gold, gold alloys, refractory metals, refractory metal compounds and refractory metal alloys. The use of a metal interconnection line less than the length corresponding to the minimum Backflow Potential Capacity for the metal can be applied in semiconductor devices having a conductive pattern comprising features, preferably features greater than about three times the minimum allowable feature for a given design rule.

After extensive research and experimentation, it was found that the Backflow Potential Capacity can be employed to reduce electromigration in metal interconnection lines even though the metal interconnection line has a length greater than the length corresponding to the minimum Backflow Potential Capacity for that metal interconnection line. Thus, in accordance with the present invention, the electromigration lifetime of a metal interconnection line is enhanced by optimizing the Backflow Potential Capacity for that metal interconnection line for conductive patterns having features in the submicron range, as well as features of one micron or greater, in which it is impractical or inefficient to limit the length of the metal interconnection line to less than the length corresponding to the minimum Backflow Potential Capacity for that metal interconnection line.

In accordance with another embodiment of the present invention, a metal interconnection line is formed in a semiconductor device having a length greater than the length corresponding to the minimum Backflow Potential Capacity for the particular metal interconnection line and in which the Backflow Potential Capacity is optimized to reduce electromigration and, hence, enhance the electromigration lifetime of the metal interconnection line. In one aspect of this embodiment, a metal interconnection line is formed on an insulating layer, which metal interconnection line has a length greater than the length corresponding to the minimum Backflow Potential Capacity for the metal interconnection line. However, one or at least two longitudinally spaced apart openings are formed through the metal interconnection line. When employing a single opening, the distance between the opening and each end of the metal interconnection line is less than the length corresponding to the minimum Backflow Potential Capacity for the metal interconnection line. When employing at least two longitudinally spaced apart openings, the distance between the two longitudinally spaced apart openings is less than the length corresponding to the minimum Backflow Potential Capacity for the metal interconnection line.

Figure 4A:
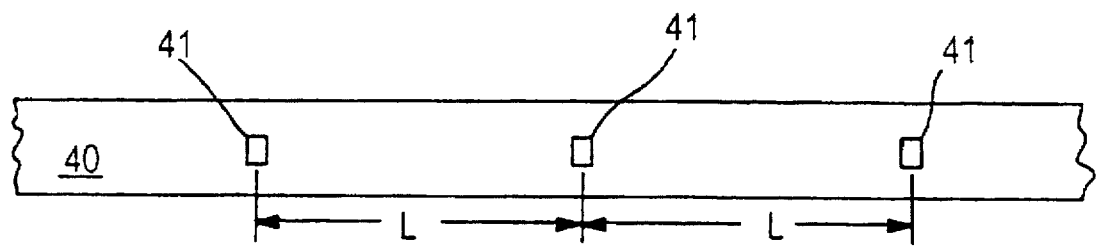
FIGS. 4A and 4B are top views of interconnection lines in accordance with the present invention.

As shown in FIG. 4A, metal interconnection line 40 is provided with a plurality of longitudinally spaced apart openings 41, preferably longitudinally aligned. Holes 41 are separated by a longitudinal distance L wherein L is less than the length corresponding to the minimum Backflow Potential Capacity for the metal interconnection line.

Figure 4B:
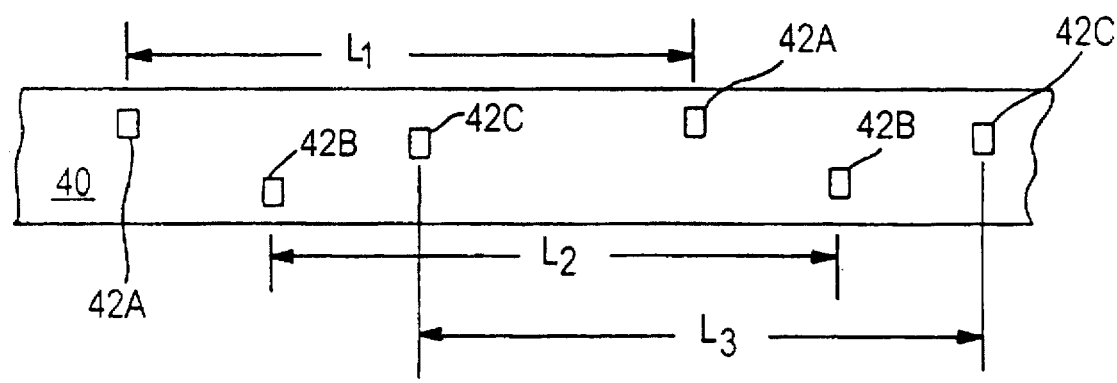

In FIG. 4B, another embodiment is shown wherein the width of the metal interconnection line 40 is wider than that depicted in FIG. 4A. As shown in FIG. 4B, a plurality of longitudinally spaced apart openings 42 are provided in metal interconnection line. Preferably, the longitudinal distance between two longitudinally aligned openings, such as the distance $L_1$ between longitudinally aligned openings 42A, the distance $L_2$ between longitudinally aligned openings 42B, and the distance $L_3$ between longitudinally aligned openings 42C, is less than the length corresponding to the minimum Backflow Potential Capacity for the metal interconnection line 40.

It is not fully understood why the provision of openings through the metal interconnection lines longitudinally spaced apart by a distance less than the length corresponding to the minimum Backflow Potential Capacity for the metal interconnection line reduces electromigration. While not wishing to be bound by any particular theory, it is believed that the provision of an opening or hole, which is filled with insulating material, presents a discontinuity which decreases the mass transport of the metal ions of the metal interconnection layer. Thus, holes are provided through the metal interconnection line along the longitudinal length of the metal interconnection line spaced apart by a distance less than the length corresponding to the Backflow Potential Capacity for the particular metal interconnection line. For metal interconnection lines for a particular metal having a short enough length, only a single hole need be provided to optimize the Backflow Potential Capacity for that particular metal.

In the various embodiments of the present invention, the length corresponding to the minimum Backflow Potential Capacity must be determined for each particular metal employed for the metal interconnection line, similar to a manner determined for aluminum as in FIG. 1. As shown in FIG. 1, the Backflow Potential Capacity for a particular metal, i.e., elemental metal or alloy, increases as the length of the metal line is reduced. This Backflow Potential Capacity increases the chemical potential gradient in a direction opposite to electromigration and, in effect, causes the Backflow Effect.

Thus, in accordance with the present invention, the electromigration of a lifetime of a metal interconnection line having a length consistent with design requirements is enhanced by the formation of one or more openings through the metal interconnection line spaced apart in the longitudinal direction, wherein the distance between each end of the metal interconnection line and a opening, or the longitudinal distance between the spaced apart openings, is less than the length corresponding to the minimum Backflow Potential Capacity for the particular metal interconnection line. The optimum size of the opening depends upon the particular metal and the width of the metal interconnection line, and could easily be determined in a particular situation by one having ordinary skill in the art. The openings in the metal interconnection line can be formed by conventional photolithographic and etching techniques, particularly anisotropic etching, such as reactive ion etching. Damascene techniques can also be employed to form the openings.

Other embodiments of the present invention wherein the Backflow Potential Capacity of a metal interconnection line is optimized, thereby minimizing electromigration failures, are applicable to multilevel interconnection patterns. Typically, semiconductor devices comprises a substrate and a plurality of consecutive levels of insulating layers and metal interconnection lines formed thereon which are electrically connected between vertical levels by conductive vias or through-holes formed in insulating layers filled with conductive material. In one embodiment of the present invention, the longitudinal distance between the contact points of conductive vias on the surface of a metal interconnection line is strategically designed so that it is less than the length corresponding to the minimum Backflow Potential Capacity for the particular metal interconnection line.

Thus, in accordance with the present invention, a semiconductor device is formed comprising a conductive pattern and a first insulating layer formed on the conductive pattern. A first metal interconnection line is formed on the first insulating layer and a second insulating layer is formed on the first metal interconnection line. At least two spaced apart first conductive vias are formed through the second insulating layer in electrical contact with the first metal interconnection line at first longitudinally spaced apart contact points a first longitudinal distance which is less than the length corresponding to the minimum Backflow Potential Capacity for the first metal interconnection line. Therefore, the length of the first metal interconnection line can exceed the length corresponding to the minimum Backflow Potential Capacity for the first metal interconnection line, while optimizing the Backflow Potential Capacity of the metal interconnection line to reduce electromigration failure.

The metal interconnection can be provided with more than two contact points with conductive vias, or a single contact point, and the Backflow Potential Capacity optimized by limiting the longitudinal distance between each contact point, or the distance between each end of the metal interconnection line and a contact point to less than the length corresponding to the minimum Backflow Potential Capacity.

It is not fully understood why the strategic longitudinal spacing of contact points of conductive vias on a metal interconnection line by a distance less than the length corresponding to the minimum Backflow Potential Capacity for the metal interconnection line enhances the Backflow Effect and reduces electromigration. Although not wishing to be bound by any particular theory, it is believed that the conductive vias provide surface discontinuities in the metal interconnection line which reduce mass transfer and, hence, electromigration.

In another embodiment of the present invention, the Backflow Potential Capacity is further optimized by employing a material to fill the conductive via different from the metal of the interconnection line, thereby providing a further discontinuity to further reduce mass transfer of ions from one level to another. When employing an aluminum or aluminum alloy metal interconnection line, it is preferred to employ a tungsten plug filling the via. In another aspect of this embodiment, an aluminum or aluminum alloy plug is employed with a barrier layer interposed between the plug and the aluminum or aluminum alloy interconnection line. Typical barrier materials can be employed, such as tungsten, tungsten-titanium, titanium, titanium/titanium nitride, titanium nitride or titanium oxynitride. In yet another aspect of this embodiment, an aluminum or aluminum alloy plug is employed in combination with an aluminum or aluminum alloy interconnection line, employing an anti-reflective coating on the aluminum or aluminum alloy plug in the via. Anti-reflective coatings are conventional in the art and can comprise titanium nitride or titanium oxynitride. The present invention also involves the combined use of a barrier layer and anti-reflective coating when providing an aluminum or aluminum alloy plug in a via in electrical contact with an aluminum or aluminum alloy interconnection line. The use of a barrier layer and/or anti-reflective coating presents a discontinuity in the material thereby decreasing mass transport and the diffusion effect of electromigration.

In another embodiment of the present invention, the Backflow Effect is utilized to reduce electromigration failure in a plurality of metal interconnection lines on different levels in electrical contact through a conductive via. In one aspect of this embodiment, a first insulating layer is formed on a conductive pattern, and a first metal interconnection line formed on the first insulating layer. A second insulating layer is formed on the first metal interconnection line with at least two longitudinally spaced apart first conductive vias formed through the second insulating layer in electrical contact with the first metal interconnection line at first longitudinally spaced apart contact points separated by a first longitudinal distance which is less than the length corresponding to the minimum Backflow Potential Capacity for the first metal interconnection line. A second metal interconnection line is then formed on the second insulating layer. The Backflow Effect is optimized for the second metal interconnection line. This objective is achieved in accordance with various aspects of the present invention. For example, the Backflow Effect is optimized for the second metal interconnection line by confining its length to less than the length corresponding to the minimum Backflow Potential Capacity for the second metal interconnection line. It was found that if the width of the first and second metal interconnection lines are substantially the same, the optimum length of the second metal interconnection line $L_2$ is represented by the formula:

$$L_2 = D_1 \left( \frac{T_2}{T_1} \right) ; \text{wherein} \quad (1)$$

$D_l$ is the first longitudinal distance, $T_2$ is the thickness of the second metal interconnection line and $T_1$ is the thickness of the first metal interconnection line.

It was further found that if the width of the first and second metal interconnection lines are not substantially equal, the optimum length of the second metal interconnection line $L_2$ is represented by the formula:

$$L_2 = D_1 \left( \frac{T_2}{T_1} \right) \left( \frac{W_2}{W_1} \right) ; \text{wherein,} \quad (2)$$

$D_1$, $T_1$ and $T_2$ are as previously defined, $W_2$ is the width of the second metal interconnection line and $W_1$ is the width of the first metal interconnection line.

In another aspect of this embodiment, the Backflow Effect for the second metal interconnection line is optimized by providing at least one hole through the second metal interconnection line, wherein the distance between each end of the second metal interconnection line and the hole, or the distance between two longitudinally spaced apart holes, is less than the length corresponding to the minimum Backflow Potential Capacity for the second metal interconnection line.

In another embodiment of the present invention wherein the Backflow Effect is utilized to reduce electromigration failure in multilevel metal interconnection lines, the second metal interconnection line formed on the second insulating layer is in electrical contact with one of the first conductive vias at a second contact point. A third insulating layer is formed on the second metal interconnection line in electrical contact and at least one second conductive via is formed through the third insulating layer in electrical contact with the second metal interconnection line at a third contact point longitudinally spaced apart from the second contact point on the second metal interconnection line by a second longitudinal distance which is less than the length corresponding to the minimum Backflow Potential Capacity for the second metal interconnection line.

In this embodiment, if the width of the present invention, wherein the first and second interconnection lines are substantially the same, the second optimum longitudinal distance $D_2$ is represented by the formula:

$$D_2 = D_1 \left( \frac{T_2}{T_1} \right) \text{; wherein} \qquad (3)$$

$D_1$, $D_2$ and $T_1$ are as previously defined. If the width of the first metal interconnection line is not essentially the same or substantially the same as the width of the second metal interconnection line, $D_2$ is represented by the formula:

$$D_2 = D_1 \left( \frac{T_2}{T_1} \right) \left( \frac{W_2}{W_1} \right) \text{; wherein} \qquad (4)$$

$D_1$, $D_2$, $T_2$, $T_1$, $W_2$ and $W_1$ are as previously defined.

Figure 2:
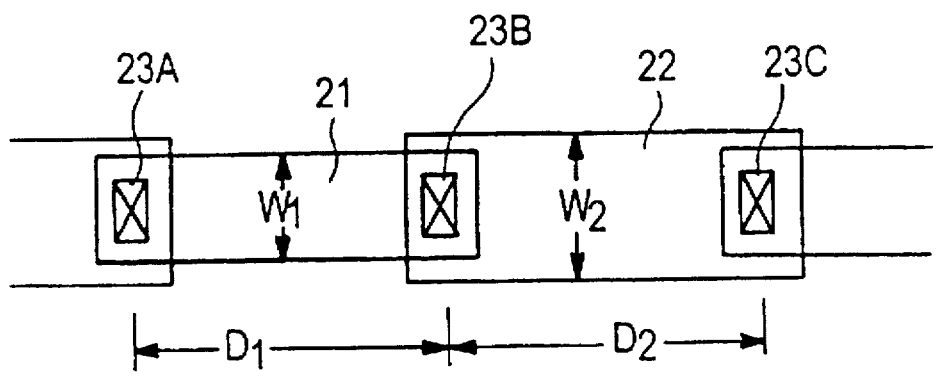
FIG. 2 is a top view of a multilevel interconnection in accordance with the present invention.

FIG. 2 schematically illustrates a top view of a multilevel metal interconnection pattern in accordance with the present invention, wherein the first metal interconnection line 21 has a width $W_1$. Electrically conductive vias 23A and 23B are provided in electrical contact with the first metal interconnection line 21 at longitudinally spaced apart contact points, separated by a first longitudinal distance $D_1$. A second metal interconnection line 22 is situated on a level above first metal interconnection line 21 and in electrical contact with conductive vias 23 and 23C at longitudinally spaced apart contact points separated by a second longitudinal distance $D_2$. In accordance with the present invention $D_1$ and $D_2$ are chosen in accordance with formulas 3 and 4 (each one), depending upon whether the widths of the first and second metal interconnection lines are substantially the same or different, respectively.

Figure 3:
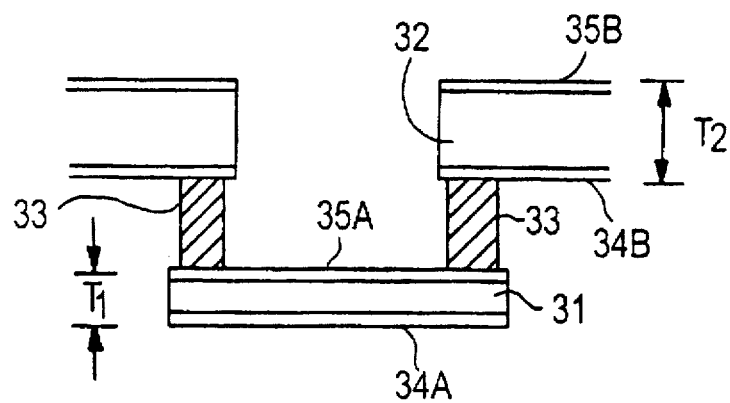
FIG. 3 is a cross-sectional view of a multilevel interconnection in accordance with the present invention.

In FIG. 3 a cross-sectional view of a metal interconnection pattern in accordance with the present invention is depicted, wherein first metal interconnection line 31 is in electrical contact with second metal interconnection layer 32 by means of conductive vias 33. The first metal interconnection line has a thickness $T_1$ and the second metal interconnection line has a thickness $T_2$. In this embodiment, the use of barrier layers 34A and 34B are shown together with anti-reflective coatings 35A and 35B. The length of the second metal interconnection line 32 is selected in accordance with formula (1) or (2), depending upon whether the widths of the first and second metal interconnection lines are substantially the same or different, respectively.

Figure 5:
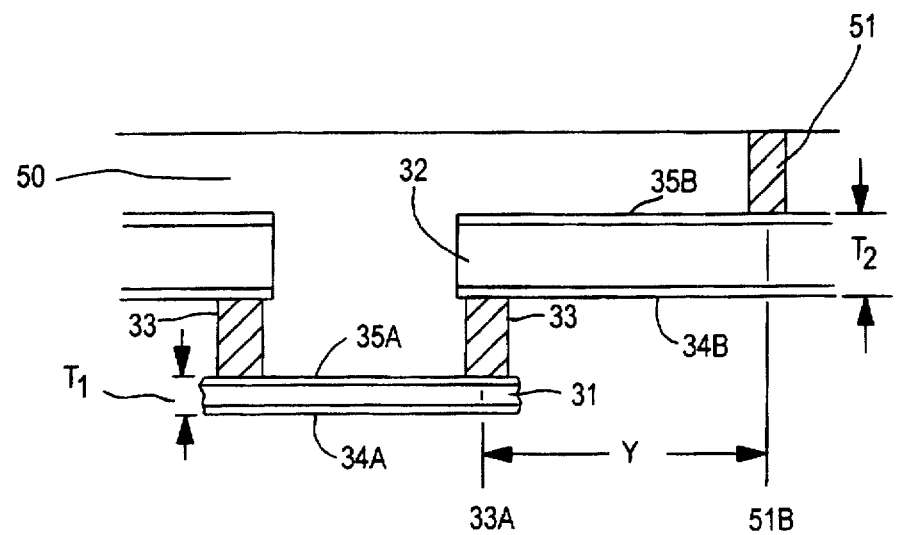
FIG. 5 is a cross-sectional view of a multilevel interconnection in accordance with the present invention.
Figure 6:
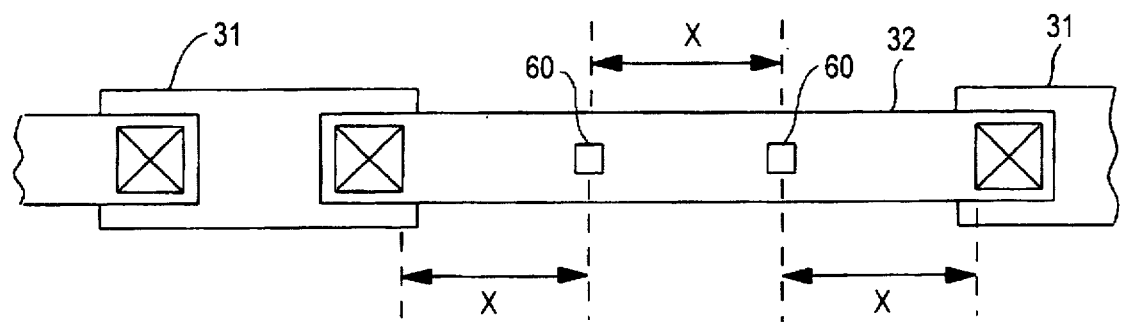
FIG. 6 is a top view of the multilevel interconnection depicted in FIG. 3.

Adverting to FIG. 5, wherein elements similar to those depicted in FIG. 3 bear similar reference numerals, an insulating layer 50 is formed on the second metal interconnection line 32. At least a second conductive via 51 through insulating layer 50 in electrical contact with second metal interconnection line 32 is formed at a contact point 51b spaced apart from contact point 33a by a distance Y which is less than the length corresponding to the minimum Backflow Potential Capacity for second metal interconnection line 32. In another embodiment, as shown in FIG. 6, the length of second metal interconnection line 32, depicted in FIG. 3, is greater than the minimum Backflow Potential Capacity for second metal interconnection line 32. However, second metal interconnection line 32 comprises at least two longitudinally spaced apart openings 60 with a longitudinal distance therebetween less than the length corresponding to the minimum Backflow Potential Capacity for second metal interconnection line 32.

The present invention is applicable of all types of semiconductor devices wherein metal interconnection lines are provided, such as bus lines, power supply lines and/or clock lines. In carrying out the present invention, conventional methods of forming conductive patterns comprising features, such as a plurality of spaced apart conductive lines, and metal interconnection lines can be employed, such as conventional photolithographic techniques, etching techniques and damascene techniques. The present invention is applicable to semiconductor devices comprising interconnection patterns having a wide range of dimensions, including submicron dimensions, which conductive patterns are formed in a conventional manner, as by conventional etch back techniques or single and/or dual damascene techniques.

Typically, a first insulating layer is deposited and a conductive pattern formed. The conductive pattern can be formed by conventional etch back techniques involving the deposition of a metal layer and etching to form a conductive pattern comprising a plurality of spaced apart conductive lines. The conductive pattern can also be formed by a damascene technique in which openings are formed in the insulating layer and metal deposited in the openings to form the conductive pattern. Subsequently, a second insulating layer is deposited and a metal interconnection line is formed on the second insulating layer. The conductive pattern and interconnection line can be formed by a dual damascene technique in which the conductive pattern and metal interconnection line are deposited by a single metal deposition process.

Damascene is an art which has been employed for centuries in the fabrication of jewelry, and has recently been adapted for application in the semiconductor industry. Damascene basically involves the formation of a trench which is filled with a metal. Thus, damascene differs from the traditional etch back techniques of providing an interconnection structure by forming a pattern of trenches in a dielectric layer, which trenches are filled in with metal to form the conductive pattern followed by planarization vis-à-vis the traditional etch back technique of depositing a metal layer, forming a conductive pattern with interwiring spacings, and filling in the interwiring spacings with dielectric material. Single and dual damascene techniques have also been employed to form openings in a dielectric layer which are subsequently filled with metal. The application of damascene techniques to the manufacture of semiconductor devices is disclosed in Joshi, "A New Damascene Structure for Submicrometer Interconnect Wiring," IEEE Electron Letters, Vol. 14, No. 3, March 1993, pp. 129–132; Kaanta et al., "Dual Damascene: A ULSI Wiring Technology," Jun. 11–12, 1991, VMIC Conference, IEEE, pp. 144–152; Kenney et al., "A Buried-Plate Trench Cell for a 64-Mb DRAM," 1992 Symposium on VLSI Technology Digest of Technical Papers, IEEE, pp. 14–15; U.S. Pat. No. 5,262,354; and U.S. Pat. No. 5,093,279. After formation of the wiring pattern, planarization is effected as by chemical-mechanical polishing.

In carrying out the present invention, the interconnection line can be formed of any metal typically employed for forming an interconnection line, such as aluminum, aluminum alloys, copper, copper alloys, gold, gold alloys, silver, silver alloys, refractory metals, refractory metal alloys, and refractory metal compounds. A conventional adhesion/barrier layer can also be employed, such as titanium, titanium-tungsten, titanium nitride, or titanium oxynitride. The metal interconnection line of the present invention can be formed by any technique conventionally employed in the manufacture of semiconductor devices. For example, the method interconnection line can be formed by conventional metallization techniques, such as various types of chemical vapor deposition (CVD) processes, including low pressure chemical vapor deposition (LPCVD), and plasma enhanced chemical vapor deposition (PECVD). Normally, when high melting metal points such as tungsten are deposited, CVD techniques are employed. Low melting point metals, such as aluminum and aluminum-base alloys, including aluminum-copper alloys, can be deposited by melting, sputtering, or physical vapor deposition (PVD).

The present invention is also applicable to the manufacture of semiconductor devices comprising a plurality of conductive patterns formed on different levels, including conductive patterns formed by etch back techniques and/or damascene and dual damascene techniques. In a preferred embodiment, such semiconductor devices comprising a plurality of conductive patterns on different levels also comprise a plurality of metal interconnection lines, having a length less than the length corresponding to the minimum Backflow Potential Capacity for the metal interconnection line, or having a length adjusted, as by openings or vias, so that the distance between the openings or vias is less than the length corresponding to the minimum Backflow Potential Capacity for the metal interconnection line, thereby reducing electromigration and enhancing the electromigration lifetime of the metal interconnection line.

The semiconductor devices to which the claimed invention is directed generally comprise insulating layers formed of insulating materials conventionally employed in the manufacture of semiconductor devices, such as silicon dioxide, including silicon dioxide formed by thermal oxidation, vapor deposition and/or derived from deposited tetraethyl orthosilicate (TEOS), silicon nitride, silicon oxynitrides and/or low dielectric constant materials. Insulating material can be deposited in a conventional manner, as by CVD or thermal enhanced CVD and spin-on techniques. The various embodiments of the present invention involve a conventional semiconductor substrate, such as monocrystalline silicon.

Thus, in accordance with the present invention, the length of a metal interconnection line is advantageously selected in accordance with the design requirements for a particular integrated circuit, while advantageously maximizing the electromigration lifetime by optimizing the Backflow Potential Capacity for the particular metal interconnection line, as by selecting an appropriate line length, providing one or more strategically longitudinally spaced holes or adjusting the distance between the points at which the metal interconnection line is in electrical contact with conductive vias, so that the longitudinal distance between the holes or vias is less than the length corresponding to the minimum Backflow Potential Capacity of the metal interconnection line.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

We claim:

1. A semiconductor device comprising:

a conductive pattern having features;

a first insulating layer formed on the conductive pattern;

a first metal interconnection line formed on the first insulating layer;

a second insulating layer formed on the first metal interconnection line;

at least two longitudinally spaced apart first conductive vias formed through the second insulating layer in electrical contact with the first metal interconnection line at first contact points separated by a first longitudinal distance which is less than the length corresponding to the minimum Backflow Potential Capacity for the first metal interconnection line; and a second metal interconnection line formed on the second insulating layer and in electrical contact with one of the first conductive vias at a second contact point, wherein the width of the first metal interconnection line is essentially the same as the width of the second metal interconnection line, and the length of the second metal interconnection line ($L_2$) is represented by the formula:

$$L_2 = D_1 \left( \frac{T_2}{T_1} \right);$$

wherein $D_1$ is the first longitudinal distance; $T_2$ is the thickness of the second metal interconnection line, and $T_1$ is the thickness of the first metal interconnection line.

2. A semiconductor device comprising:

a conductive pattern having features;

a first insulating layer formed on the conductive pattern;

a first metal interconnection line formed on the first insulating layer;

a second insulating layer formed on the first metal interconnection line;

at least two longitudinally spaced apart first conductive vias formed through the second insulating layer in electrical contact with the first metal interconnection line at first contact points separated by a first longitudinal distance which is less than the length corresponding to the minimum Backflow Potential Capacity for the first metal interconnection line; and a second metal interconnection line formed on the second insulating layer and in electrical contact with one of the first conductive vias at a second contact point, a third insulating layer formed on the second metal interconnection line; and at least one second conductive via formed through the third insulating layer in electrical contact with the second metal interconnection line at a third contact point longitudinally spaced apart from the second contact point on the second metal interconnection line by a second longitudinal distance which is less than the length corresponding to the minimum Backflow Potential Capacity for the second metal interconnection line, wherein the width of the first metal interconnection line is essentially the same as the width of the second metal interconnection line, and the second longitudinal distance $D_2$ is represented by the formula:

$$D_2 = D_1 \left( \frac{T_2}{T_1} \right);$$

wherein $D_1$ is the first longitudinal distance, $T_2$ is the thickness of the second metal interconnection line and $T_1$ is the thickness of the first metal interconnection line.

3. A semiconductor device comprising:

a conductive pattern having features;

a first insulating layer formed on the conductive pattern;

a first metal interconnection line formed on the first insulating layer;

a second insulating layer formed on the first metal interconnection line;

at least two longitudinally spaced apart first conductive vias formed through the second insulating layer in electrical contact with the first metal interconnection line at first contact points separated by a first longitudinal distance which is less than the length corresponding to the minimum Backflow Potential Capacity for the first metal interconnection line; and a second metal interconnection line formed on the second insulating layer and in electrical contact with one of the first conductive vias at a second contact point, wherein the width of the first metal interconnection line is not substantially equal to the width of the second metal interconnection line, and wherein the length of the second metal interconnection line ($L_2$) is represented by the formula:

$$L_2 = D_1 \left(\frac{T_2}{T_1}\right)\left(\frac{W_2}{W_1}\right);$$

wherein $D_1$ is the first longitudinal distance, $T_2$ is the thickness of the second metal interconnection line; $T_1$ is the thickness of the first metal interconnection line; $W_2$ is the width of the second metal interconnection line; and $W_1$ is the width of the first metal interconnection line.

4. A semiconductor device comprising:

a conductive pattern having features;

a first insulating layer formed on the conductive pattern;

a first metal interconnection line formed on the first insulating layer;

a second insulating layer formed on the first metal interconnection line;

at least two longitudinally spaced apart first conductive vias formed through the second insulating layer in electrical contact with the first metal interconnection line at first contact points separated by a first longitudinal distance which is less than the length corresponding to the minimum Backflow Potential Capacity for the first metal interconnection line; and a second metal interconnection line formed on the second insulating layer and in electrical contact with one of the first conductive vias at a second contact point, a third insulating layer formed on the second metal interconnection line; and at least one second conductive via formed through the third insulating layer in electrical contact with the second metal interconnection line at a third contact point longitudinally spaced apart from the second contact point on the second metal interconnection line by a second longitudinal distance which is less than the length corresponding to the minimum Backflow Potential Capacity for the second metal interconnection line, wherein the width of the first metal interconnection line is not substantially equal to the width of the second metal interconnection line, wherein the second longitudinal distance ($D_2$) is represented by the formula:

$$D_2 = D_1 \left(\frac{T_2}{T_1}\right)\left(\frac{W_2}{W_1}\right);$$

wherein $D_1$ is the first longitudinal distance, $T_2$ is the thickness of the second metal interconnection line; $T_1$ is the thickness of the first metal interconnection line; $W_2$ is the width of the second metal interconnection line; and $W_1$ is the width of the first metal interconnection line.

5. A semiconductor device comprising:

a conductive pattern having features;

a first insulating layer formed on the conductive pattern;

a first metal interconnection line formed on the first insulating layer;

a second insulating layer formed on the first metal interconnection line;

at least two longitudinal spaced apart first conductive vias formed through the second insulating layer in electrical contact with the first metal interconnection line at first contact points separated by a first longitudinal distance which is less than the length corresponding to the minimum Backflow Potential Capacity for the first metal interconnection line; and a second metal interconnection line formed on the second insulating layer and in electrical contact with one of the first conductive vias at a second contact point, wherein the second metal interconnection layer has a length greater than the length corresponding to the minimum Backflow Potential Capacity for the second metal interconnection line; and the second metal interconnection layer comprises at least two longitudinally spaced apart openings extending therethrough; wherein the longitudinal distance between the two openings is less than the length corresponding to the minimum Backflow Potential Capacity for the second metal interconnection line.

* * * * *